(12) United States Patent
Vise (10) Patent No.: US 11,741,507 B2
(45) Date of Patent: Aug. 29, 2023

(54) MANAGEMENT OF DISPLAY FIXTURES

(71) Applicant: UNEFI INC., Toronto (CA)

(72) Inventor: Samuel Arthur Vise, Toronto (CA)

(73) Assignee: UNEFI INC., Toronto (CA)

( * ) Notice: Subject to any disclaimer, the term of this patent is extended or adjusted under 35 U.S.C. 154(b) by 4 days.

(21) Appl. No.: 17/390,508

(22) Filed: Jul. 30, 2021

(65) Prior Publication Data

US 2022/0067793 A1    Mar. 3, 2022

Related U.S. Application Data

(60) Provisional application No. 63/071,484, filed on Aug. 28, 2020.

(51) Int. Cl.
   *G06Q 30/02*       (2023.01)
   *G06Q 30/0241*     (2023.01)
   *G06F 16/2457*     (2019.01)
   *G06F 16/16*       (2019.01)
   *G06F 30/12*       (2020.01)

(52) U.S. Cl.
   CPC ....... *G06Q 30/0276* (2013.01); *G06F 16/168* (2019.01); *G06F 16/24573* (2019.01); *G06F 30/12* (2020.01)

(58) Field of Classification Search
   CPC .............. G06Q 30/0276; G06F 16/168; G06F 16/24573; G06F 30/12
   See application file for complete search history.

(56) References Cited

U.S. PATENT DOCUMENTS

| | | | |
|---|---|---|---|
| 10,372,839 B2 * | 8/2019 | Lavrov | H04L 67/1097 |
| 2003/0222762 A1 | 12/2003 | Beigl et al. | |
| 2004/0117383 A1 | 6/2004 | Lee et al. | |
| 2008/0103851 A1 | 5/2008 | Walker et al. | |
| 2009/0043676 A1 | 2/2009 | Riley et al. | |
| 2011/0288938 A1 | 11/2011 | Cook et al. | |
| 2013/0054374 A1 * | 2/2013 | Pulos | G06Q 30/02 705/14.65 |
| 2016/0335586 A1 | 11/2016 | Panchamgam | |
| 2020/0242077 A1 * | 7/2020 | Dain | G06F 16/24573 |
| 2021/0065080 A1 * | 3/2021 | Brockman, IV | G06Q 10/0637 |

OTHER PUBLICATIONS

Hui Wang, Yiming (Kevin) Rong, Hua Li, Price Shaun, Computer aided fixture design: Recent research and trends, Computer-Aided Design, vol. 42, Issue 12, 1085-1094. (Year: 2010).*

* cited by examiner

*Primary Examiner* — Waseem Ashraf
*Assistant Examiner* — Christopher C Busch
(74) *Attorney, Agent, or Firm* — Brion Raffoul (57) ABSTRACT

Systems and methods for managing display fixtures, especially display fixtures for use in marketing and promotions. Multiple software modules allow a user to design/configure a tangible display fixture by selecting components used to assemble and populate the display fixture. Once designed, the various components of the display fixture can be tagged with suitable metadata to allow for easy generation of lists of components associated with that specifically designed or configured display fixture.

14 Claims, 14 Drawing Sheets

| | |
|---|---|
| 🔲 * | MOTOMN44X360818**<br>44x36<br>English<br>SKU: MOTOMN44X360818 |
| 🔲 * | MOTOMN44X360619**<br>44x36<br>English<br>SKU: MOTOMN44X360619 |
| 🔲 * | XX1KVPMN44X360419**<br>44x36<br>English<br>SKU: XX1KVPMN44X360419 |
| * | PROVPICKMN44X360719**<br>44x36<br>English<br>SKU: N93E1088 |
| 🔲 * | SAMS20MN44X360320**<br>44x36<br>English<br>SKU: SAMS20MN44X360320 |
| 🔲 * | IPMN44X360918**<br>44x36<br>English<br>SKU: IPMN44X360918 |

| SKU: 1FG50ENFR | 30W USB-C POWER ADAPTER-USA SKU:MR2A2LL/A | 400GB SanDisk UltraPLUS microSDXCTMUHS-I Cardwith Adapter SKU: SDSQUBR-400G-ANCMA | 45W USB-C Power Adapter, US/CAN SKU: GA00196-US | 52153VZRHOC SKU: 52153VZRHOC | 738063-1100 SKU: 738063-1100 | 738102-1100 SKU: 738102-1100 | 739523-1310 SKU: 739523-1310 | 739617-1110 SKU: 739617-1110 | 741158-0010 FLEX SKU: 741158-0010 FLEX |
|---|---|---|---|---|---|---|---|---|---|
| | *** | *** | *** | | *** | *** | *** | *** | *** |

MANAGEMENT OF DISPLAY FIXTURES

RELATED APPLICATIONS

This application claims the benefit of U.S. Provisional Application No. 63/071,484 filed on Aug. 28, 2020.

TECHNICAL FIELD

The present invention relates to the management of materials for use in promotions and advertising. More specifically, the present invention relates to systems and methods for organizing such materials for specific locations or specific marketing campaigns.

BACKGROUND

The technological and communications revolution of the early 21st century has transformed many industries. Included in these industries is advertising and product promotion. Now, brand and promotion managers can virtually design display stands to ensure proper signage placement and product exposure.

However, while the design of the display stand, with proper product placement and marketing signage deployment, is possible, current systems do not allow for the proper generation of what print materials and products are necessary for such displays. Such a capability would be invaluable to not just visual designers but to those in charge of deployment and to those in charge of provisioning such displays.

There is, therefore, a need for systems and methods that provide the capability noted above.

SUMMARY

The present invention provides systems and methods for managing display fixtures, especially display fixtures for use in marketing and promotions. In the present invention, multiple software modules allow a user to design/configure a tangible display fixture by selecting components used to assemble and populate the display fixture. Once a fixture is placed on a floorplan, the various components of the display fixture can be tagged with suitable metadata to allow for easy generation of lists of components associated with that specific fixture or configured display fixture.

In a first aspect, the present invention provides a system for managing tangible display fixtures for physical stores, the system comprising:

a database module embodied in a server, said database module managing a database containing records relating to components, said components including components for use in assembling at least a portion of said tangible display fixtures and including components for display on said tangible display fixtures;

an inventory module embodied in said server, said inventory module retrieving records from said database using said database module and enabling a user of said system to view listings of said components by way of at least one panel on a user interface and enabling said user to select components to be used on said tangible display fixtures;

a presentation module embodied in said server, said presentation module enabling said user to view images of selected components selected by said user from said listings, said presentation module also enabling said user to place images of said selected components on an image of a tangible display fixture to thereby design or configure said tangible display fixture;

a tagging module embodied in said server, said tagging module enabling said user to automatically add tagging data to records of said selected components regardless of a type or class of component;

wherein said tagging data enables said user to generate lists of selected components when used with said database.

In a second aspect, the present invention provides a method for managing tangible display fixtures for physical stores, the method comprising:

retrieving records for components from a database using a database module, said components including components for use in assembling at least a portion of said tangible display fixtures and including components for display on said tangible display fixtures;

presenting listings of said components to a user by way of at least one panel on a user interface;

receiving selection input from said user, said selection input being input that selects at least one of said components from said listings;

presenting images of selected components to said user and enabling said user to place images of said selected components on an image of a tangible display fixture to thereby design or configure said tangible display fixture;

receiving tagging input from said user, said tagging input being input that causes automatic addition of tagging data to records of said selected components regardless of a type or class of component;

wherein said selected components are components selected by said user for use in assembling of said tangible display fixture or for display on said tangible display fixture; and wherein said tagging data enables said user to generate lists of selected components when used with said database.

BRIEF DESCRIPTION OF THE DRAWINGS

The embodiments of the present invention will now be described by reference to the following figures, in which identical reference numerals in different figures indicate identical elements and in which.

DETAILED DESCRIPTION

In one aspect, the present invention provides a system that presents lists or compilations of components to a user. These components are then selected and combined by the user into desired displays for marketing and/or promotions. The combined components that make up the desired displays can then be tagged by the user using predefined or custom tags.

The tags for the various components can be stored in the list or compilations such that the components for a particular tag can easily be retrieved from the list or compilation.

It should be clear that the system is eminently useful for use by larger companies with a number of products or services being sold in multiple stores, in multiple geographical locations, and with specific marketing/promotional campaigns that may be specific to geographical or market locations. As such, a user may design a display unit or a promotional kiosk for a promotional campaign that only covers Maine and Alberta. Similarly, different display unit or promotional stand or kiosk may be designed specifically for the Toronto market or for the Boston market. These display stands or display unit may include banners, posters, signs, as well as demonstration products, mock-ups of products, handouts, flyers, and promotional giveaways (e.g., stickers, refrigerator magnets, pens, executive toys, and the like). In addition to these components, the display stands, or units also have more components that may include the physical and/or structural parts of the units themselves such as shelves, screws, nuts, bolts, nails, panels, beams, platforms, etc., etc.

Figure 1:
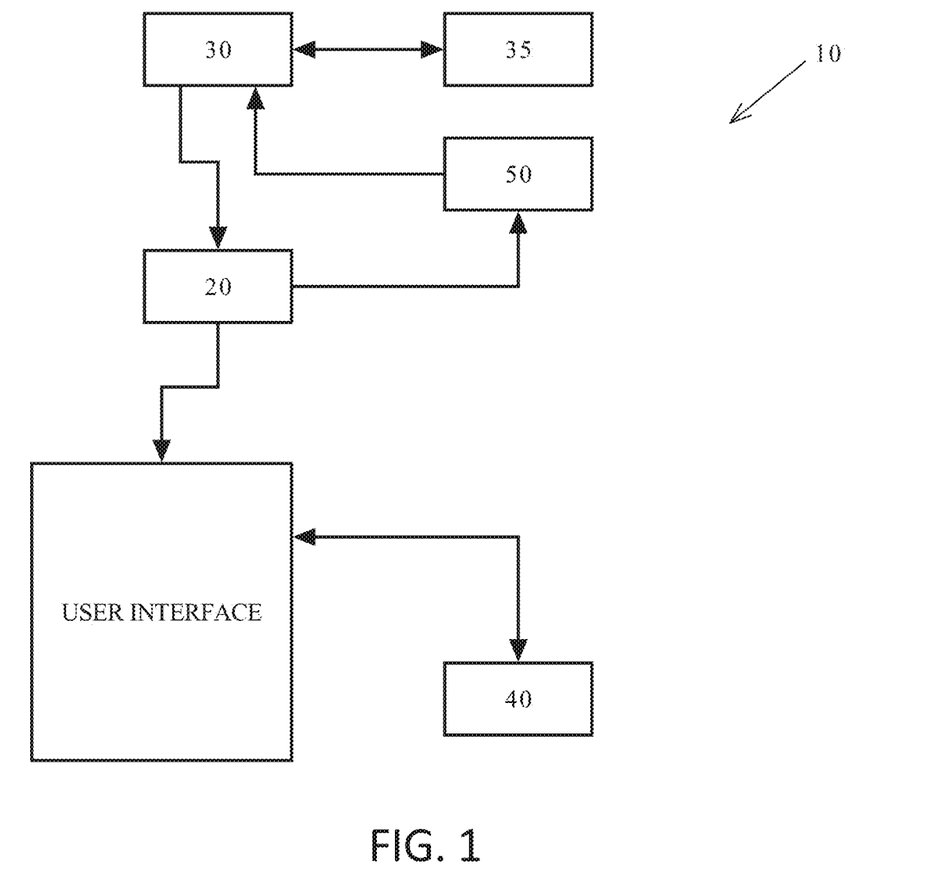
FIG. 1 is a block diagram of a system according to one aspect of the present invention.

Referring to FIG. 1, a block diagram of one aspect of the present invention is illustrated. As can be seen, this aspect of the present invention is a system 10 that has an inventory module 20, a database module 30, a presentation module 40, and a tagging module 50. The inventory module 20 presents that lists of components to the user and the various components are user selectable. Records for each of the components are stored by the database module 30 in a database 35 and are retrieved as necessary. These records are used by the inventory module to determine which components to show to the user. Selecting a component presents the user with an image of that component on the presentation module 30. The images of the selected components can then be arranged as desired to provide the desired display using the presentation module 30. The tagging module 40 is then used by the user to tag or add metadata to the record of each component that has been arranged into the desired display. The tagged record for each component can then be saved by the database module 30 in the database 35. Searches for specifically tagged components can then be easily performed on the database in the database module.

It should be clear that a record for a component may have as many tags as necessary and that the tags may be marketing program specific, location specific, or promotion specific. Thus, a specific tag may be used to mark components for use in a summer specific marketing campaign or for a month-long sale on specific products. As well, specific tags may be used to denote components specifically for stores in a specific part of a country or even for specific cities. Thus, a specific tag may be created to tag components for use in stores in Chicago or for stores in Michigan. The record for each component as stored in the database may include an image for the component as well as other relevant data for that component (e.g., physical size).

In addition to the above, the system may provide background assistance such that the designer/user does not have to specify each and every component for a display stand/kiosk. Thus, in the list or compilation of components, the system may present the user with a number of predetermined and predesigned kiosks or stands with predefined dimensions. Should the user select one of these predesigned kiosks or units, all of the necessary equipment to assemble the kiosk or unit (i.e., the shelves, braces, screws, nuts, bolts, etc.) is automatically selected as well. Of course, should the designer/user decide to tag the selected kiosk or unit for a specific location/marketing campaign, all of the necessary equipment for that kiosk or unit is similarly tagged as well. It should be clear that the above applies not just to display kiosks or large display units but also to stands, podiums, and other equipment that may require assembly and multiple parts and components prior to use. Of course, the designer/user may also separately designate extra components for these predesigned kiosks or stands as necessary. As an example, the system may have a predesigned stand with two shelves, but which can be configured for up to four shelves. The designer/user may thus add enough hardware so that the stand is configured for four shelves, with the extra hardware including an extra four brackets (two per extra shelf) and two extra shelves.

It should be clear that the various modules described above are software modules that are executed by a suitable data processor or processors. The system may be embodied in one or more servers containing the executable object code as well as the necessary database of components noted above. In one implementation, the system is web based such that a user can login using a web browser and access the various modules noted above. The user can be presented with the various components in one or more panels and a presentation panel provides workspace on which the user can be presented with images of the various components. The user clicks on a component in the component list and an image of that component is shown on the presentation panel. This image can then be placed accordingly to thereby allow the user to configure the display unit/kiosk. Once the display unit/kiosk has been properly designed and provisioned, the user can then apply a predetermined tag or a custom tag to the components selected for that configuration of the display unit/kiosk. The tagging module then applies the suitable metadata to the records for those selected components and the records are suitably stored in the database using the database module. The tagging data is applied to or added to the records of the selected component regardless of the type, class, or form of the component being tagged. Thus, the tagging data may be applied to the physical parts used to assemble the display unit, the signage to be placed on the display unit, promotional material to be placed or displayed on the display unit, and mock-ups of products or actual products to be displayed on the display unit. This way, lists of components can be easily generated regardless of the type of components tagged—a database search for specific tags will result in lists of components with that tag regardless of the component so tagged.

It should be clear that custom tags may be configured before the display unit/kiosk is designed. After the custom tag (e.g., a tag for a specific marketing campaign) is designated/created, the user can then design/configure the display kiosk/unit. With the design completed, the user can then designate which components are to be tagged with that custom tag. The user can designate that the physical components of the display kiosk (i.e., the nuts, bolts, panels, braces, frames, etc.) are to be tagged. The user can also designate that the various signs, flyers, and other promotional materials are to be tagged. In addition, the display products, product mock-ups, and other product related display items can also be tagged. Or, the user can simply indicate that all items associated with the newly designed display unit/kiosk are to be tagged with the created tag/metadata.

Referring to FIGS. 2-6, illustrated are screenshots of one implementation of the present invention.

Figure 2:
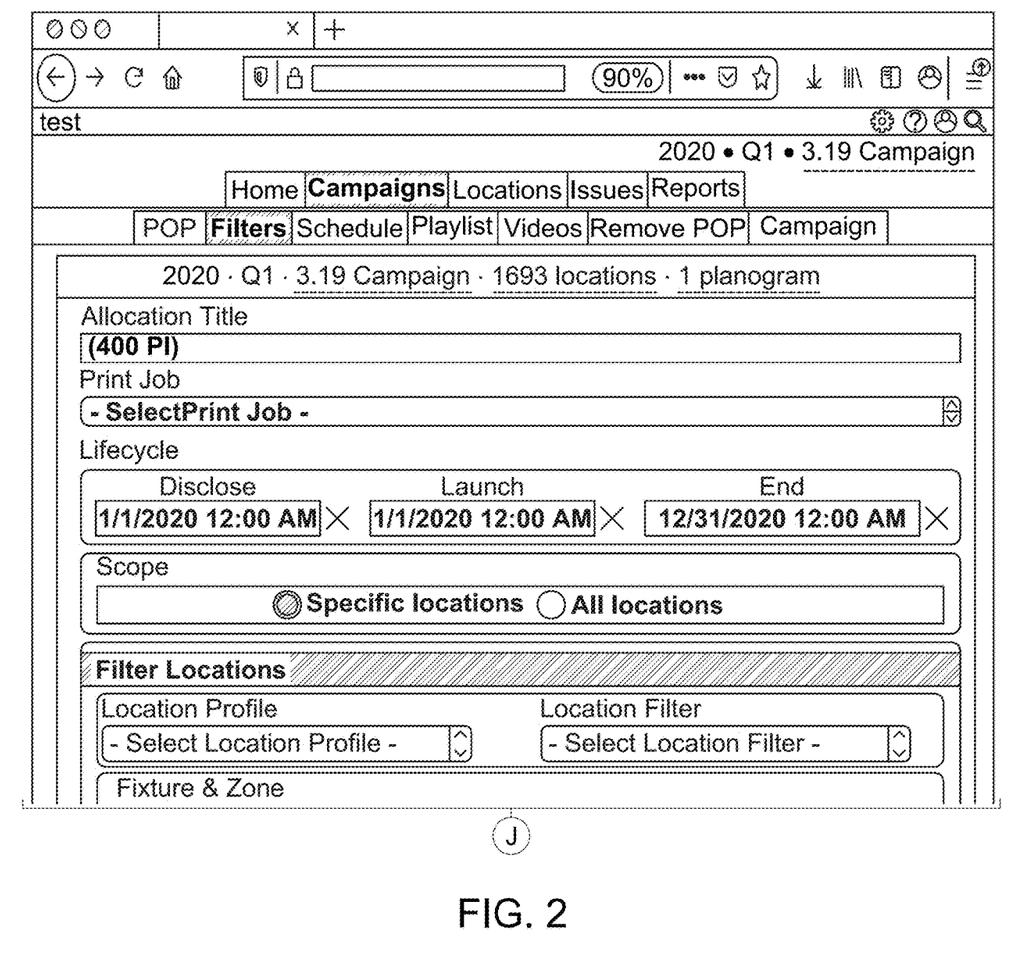
FIG. 2 is a screenshot of an implementation of the present invention detailing the designation of a custom tag.

Referring to FIG. 2, a screenshot of a user interface for defining a custom tag is shown. As can be seen, the custom tag is for a specific marketing campaign including the date and time for the public disclosure of the campaign, the launch date of the campaign, and the end of the campaign. These dates can also be used for the beginning and ending of the validity of the custom tag. Thus, once the end of the campaign has been reached, the custom tag may be automatically deactivated or rendered useless and removed from the relevant records. As can also be seen, the tag may be applied so that it can be location specific and zone specific (e.g., specific to a zone inside a store).

Figure 3:
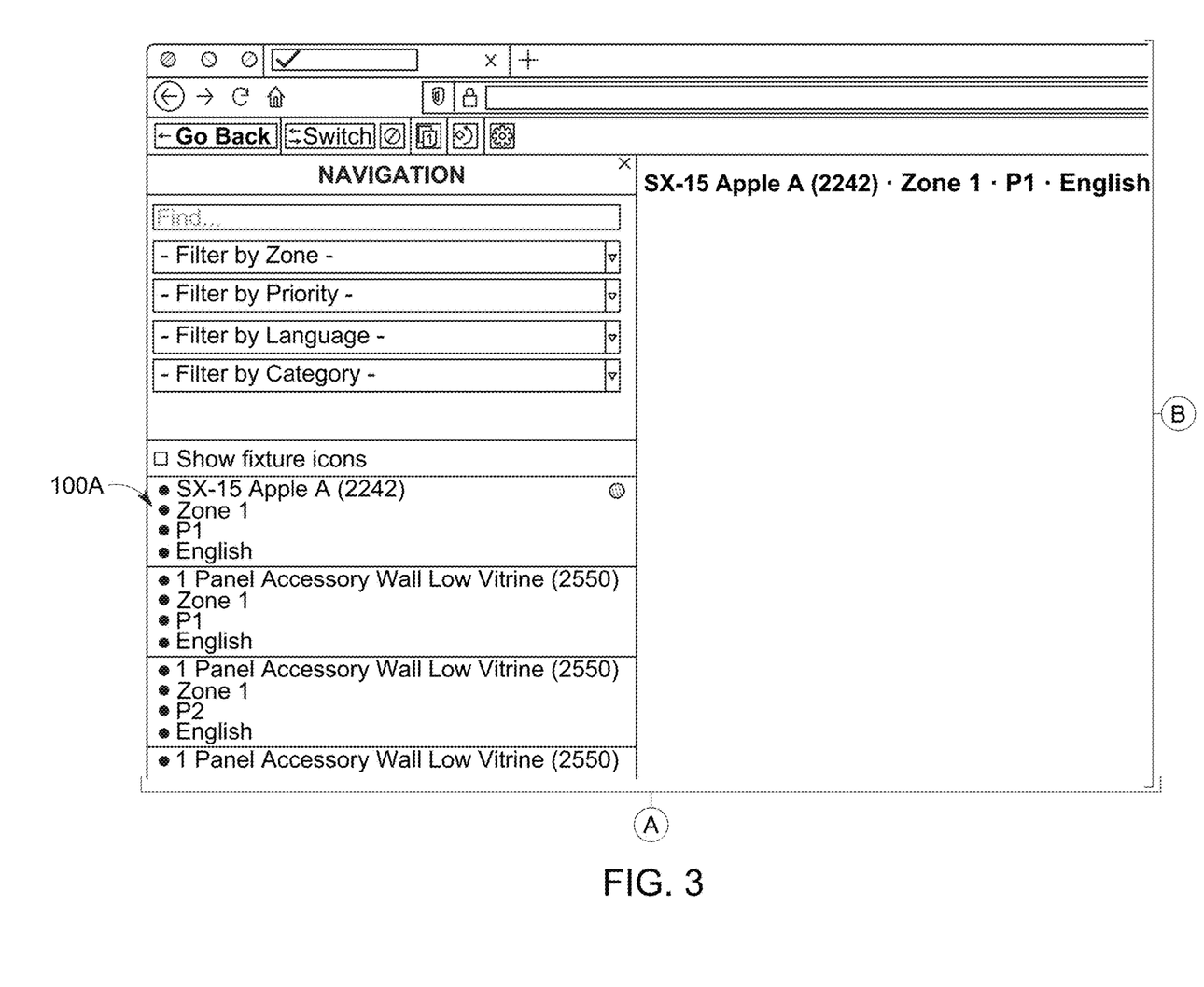
FIG. 3 is a screenshot of a user interface detailing multiple panels for listing components and for viewing a display unit.

Referring to FIG. 3, a screenshot of a user interface for use with the present invention is illustrated. As can be seen, two component panels 100A, 100B are provided along with a presentation panel 110. In this configuration, the presentation panel is between the two component panels 100A, 100B. The component panel 100A lists components which can be used to design/construct the actual display unit/kiosk while component panel 100B lists components that are to be displayed on the display unit/kiosk. As can be seen, the component panel 100A lists the accessory walls along with a predesigned display unit/kiosk. Component panel 100B on the other hand, lists the various products that can be displayed on the display kiosk (e.g., in this instance these are cell phones or mobile handsets) as well as marketing materials such as signage, leaflets, handouts, etc. The predesigned display unit/kiosk 120 shows spots 130A, 130B where products, sample products, or mock-ups of products can be placed. As can be seen, the component panel 100A lists not just a description of the component but the language used on the component and the placement (zone) of the component. For component panel 100B, listed for each component is an illustration of the product, the product's SKU, the product's physical dimensions, as well as the language used on/for the product. Also listed in the component panel 100B are signs, posters, and other marketing materials for the relevant products. These signs can be placed within the image of the display unit/kiosk as necessary such that the user is provided with an image of the final designed display unit/kiosk as it will be deployed in retail outlets. It should be clear that, in some implementations, the component panel provides both the size of the actual product as well as the size of the product in its packaging/box.

Figure 4:
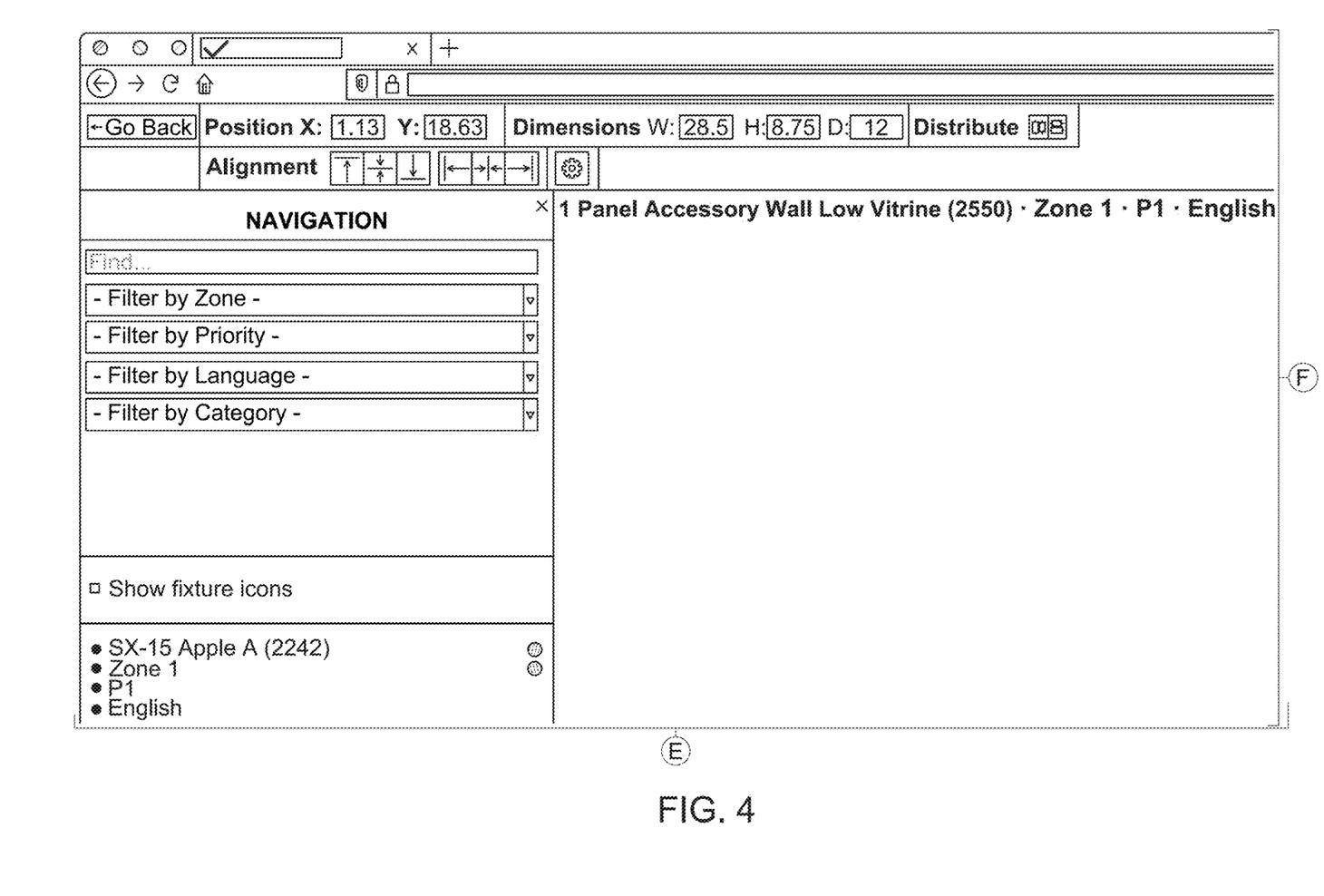
FIG. 4 is a screenshot detailing a component of a display unit and the subcomponents that may be associated/displayed on the display unit.

Referring to FIG. 4, illustrated is a component of the display unit/kiosk while the component panel 100B lists the various add-ons and subcomponents for that component shown in the presentation panel. As can be seen, the component (listed and highlighted in the left panel) is an accessory panel while the subcomponents that can be used with this component include various power adapters and a tempered glass display protector.

Figure 5:
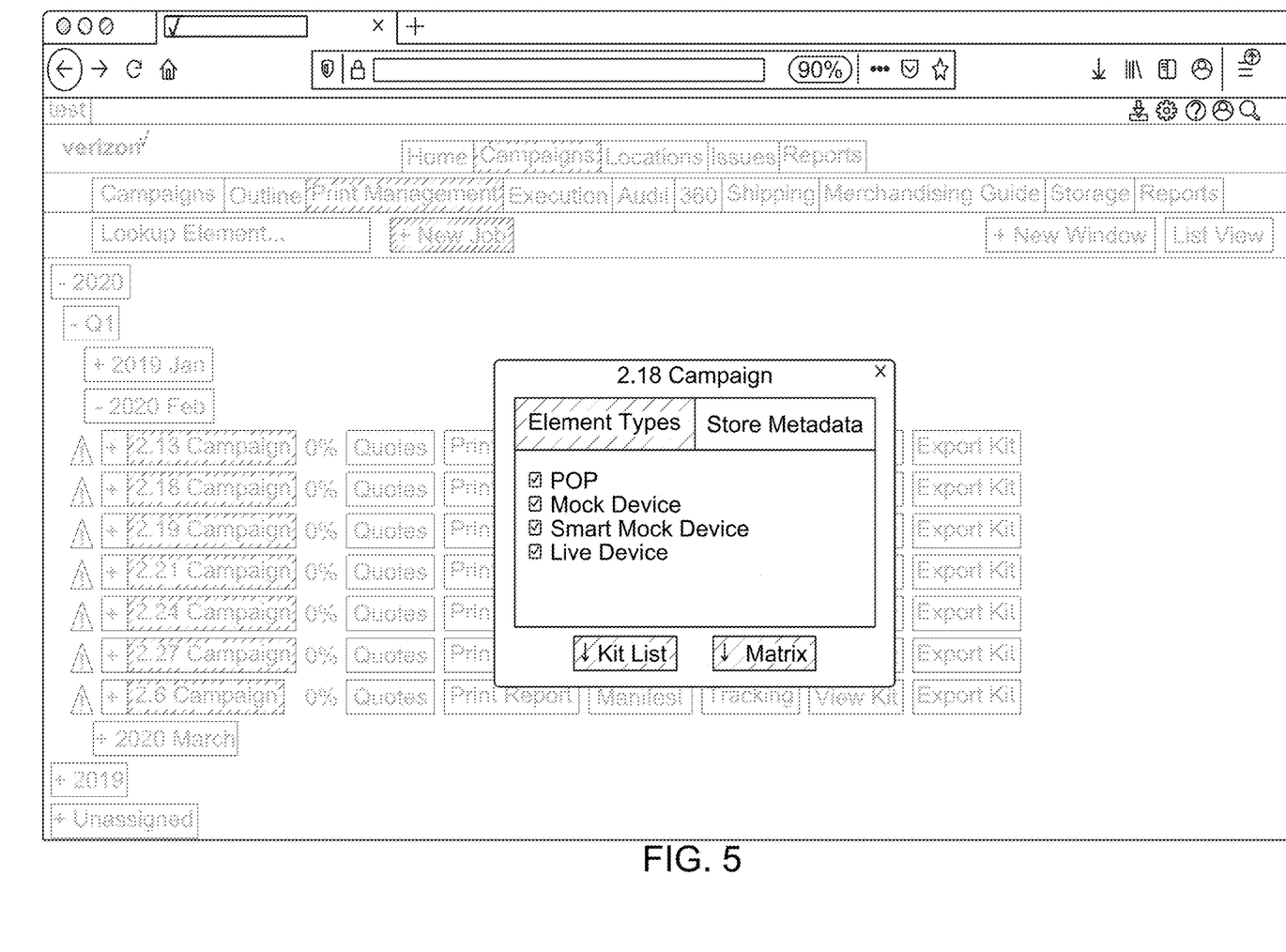
FIG. 5 is screenshot of a user interface for detailing which components and categories of components are to be tagged with specific tag data.

Referring to FIG. 5, a user interface for designating which components are to be tagged is illustrated. As can be seen, the various types of components for the display unit/kiosk are shown. In this example, the POP (point of purchase), the mock-up of a product, a smart mock-up of the product, and a live instance of the product itself are all to be tagged with the metadata.

Figure 6:
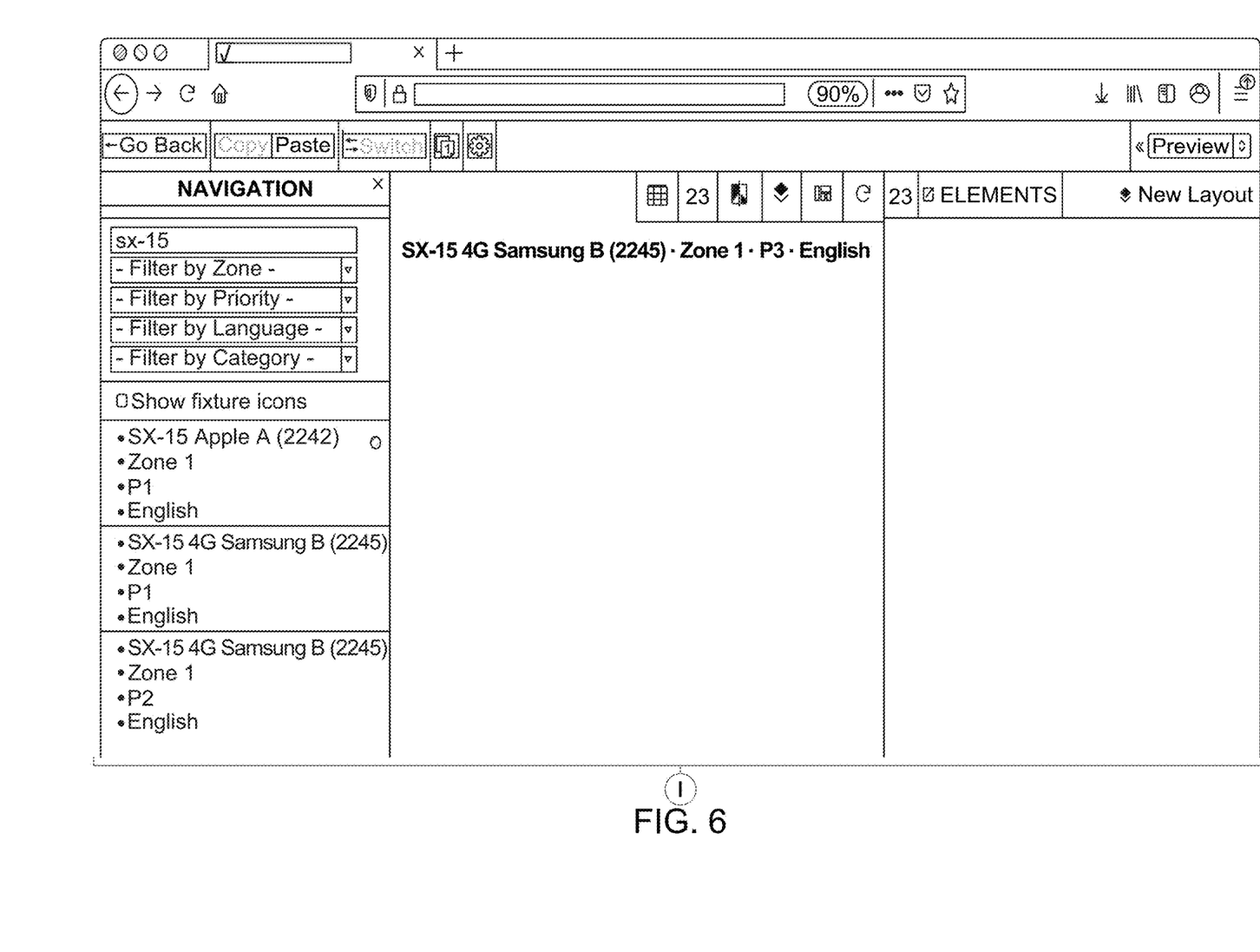
FIG. 6 is screenshot showing a finalized display unit as configured/designed by a user and showing the components displayed on the display unit.

Referring to FIG. 6, the finalized display unit/kiosk is illustrated with the various products, signage, and other marketing materials being properly deployed on the unit/kiosk. It should be clear that, once the display has been configured, the components of that display, including the physical components of the display itself, the product(s) to be displayed, as well as all the associated marketing/promotional material, can be tagged with suitable metadata and this will cause their records in the database to be similarly tagged. Then, to generate a list of components for a specific marketing campaign, one merely has to perform a database search for records in the database that are tagged with the custom tag for that specific marketing campaign. Similarly, to generate a list of components for a specific store (assuming the store has its own custom tag), one merely needs to perform a search in the database for records with the specific store's custom tag.

The embodiments of the invention may be executed by a computer processor or similar device programmed in the manner of method steps, or may be executed by an electronic system which is provided with means for executing these steps. Similarly, an electronic memory means such as computer diskettes, CD-ROMs, Random Access Memory (RAM), Read Only Memory (ROM) or similar computer software storage media known in the art, may be programmed to execute such method steps. As well, electronic signals representing these method steps may also be transmitted via a communication network.

Embodiments of the invention may be implemented in any conventional computer programming language. For example, preferred embodiments may be implemented in a procedural programming language (e.g., "C") or an object-oriented language (e.g.,"C++", "Java", "PHP", "PYTHON" or "C#"). Alternative embodiments of the invention may be implemented as pre-programmed hardware elements, other related components, or as a combination of hardware and software components.

Embodiments can be implemented as a computer program product for use with a computer system. Such implementations may include a series of computer instructions fixed either on a tangible medium, such as a computer readable medium (e.g., a diskette, CD-ROM, ROM, or fixed disk) or transmittable to a computer system, via a modem or other interface device, such as a communications adapter connected to a network over a medium. The medium may be either a tangible medium (e.g., optical or electrical communications lines) or a medium implemented with wireless techniques (e.g., microwave, infrared or other transmission techniques). The series of computer instructions embodies all or part of the functionality previously described herein. Those skilled in the art should appreciate that such computer instructions can be written in a number of programming languages for use with many computer architectures or operating systems. Furthermore, such instructions may be stored in any memory device, such as semiconductor, magnetic, optical or other memory devices, and may be transmitted using any communications technology, such as optical, infrared, microwave, or other transmission technologies. It is expected that such a computer program product may be distributed as a removable medium with accompanying printed or electronic documentation (e.g., shrink-wrapped software), preloaded with a computer system (e.g., on system ROM or fixed disk), or distributed from a server over a network (e.g., the Internet or World Wide Web). Of course, some embodiments of the invention may be implemented as a combination of both software (e.g., a computer program product) and hardware. Still other embodiments of the invention may be implemented as entirely hardware, or entirely software (e.g., a computer program product).

A person understanding this invention may now conceive of alternative structures and embodiments or variations of the above all of which are intended to fall within the scope of the invention as defined in the claims that follow.

We claim:

1. A system for managing tangible display fixtures for physical stores, the system comprising:

a database module embodied in a server, said database module managing a database containing records relating to individual components, said individual components including components for use in assembling at least a portion of said tangible display fixtures and including components for display on said tangible display fixtures;

an inventory module embodied in said server, said inventory module retrieving records from said database using said database module and displaying to a user of said system listings of said individual components by way of at least one panel on a user interface and enabling said user to select components to be used on said tangible display fixtures;

a presentation module embodied in said server, said presentation module displaying to said user images of selected components selected by said user from said listings, said presentation module also enabling said user to place images of said selected components on an image of a tangible display fixture to thereby design or configure said tangible display fixture; and a tagging module embodied in said server, said tagging module enabling said user to automatically add tags to records of said selected components regardless of a type or class of component;

wherein said database is devoid of records for collections of components needed for a configured tangible display fixture, wherein associations between components are implemented using said tags for their records such that associated components are associated with one another by having records that have common tags;

wherein said components for use in assembling at least a portion of specific tangible display fixtures have records with fixture tags denoting said specific tangible display fixtures;

wherein said system implements a method for managing said tangible display fixtures comprising:

a) receiving user input comprising user selections of at least one specific tangible display fixture and of at least one component used in configuring said at least one specific tangible display fixture to result in a configured tangible display fixture;

b) receiving user input detailing that said configured tangible display fixture is complete;

c) generating a custom tag for use in tagging components used in said configured tangible display fixture;

d) applying said custom tag to metadata for records of all components detailed by user input in step a);

e) determining fixture tags for said at least one specific tangible display fixture detailed in said user input in step a);

f) searching said database for records with said fixture tags determined in step e);

g) applying said custom tag to metadata of records found in step f);

h) searching said database for records with said custom tag;

i) compiling a list of components corresponding to said records found in step h); and j) presenting said list of components to said user.

2. The system according to claim 1, wherein said components include at least one of:
promotional materials;
marketing materials;
mock ups of products;
products to be displayed;
physical parts for use in display unit assembly;
signs for promoting products;
signs for promoting services;
marketing handouts;
marketing flyers;
marketing leaflets;
marketing giveaways;
shelves;
nuts;
bolts;
screws; and
display unit frame.

3. The system according to claim 1, wherein said tags comprise metadata added to said records of selected components.

4. The system according to claim 1, wherein said user input comprises images of selected components dragged by said user from said at least one panel to a presentation panel on said user interface to thereby design or configure said tangible display fixture.

5. The system according to claim 1, wherein said components includes predesigned display units.

6. The system according to claim 1, wherein said inventory module displays listings of said components to said user by way of two panels on said user interface.

7. The system according to claim 6, wherein said two panels comprises:
a first panel listing components for use in assembling said tangible display fixture; and
a second panel listing components for display on said tangible display fixture.

8. A method for managing tangible display fixtures for physical stores, the method comprising:

a) retrieving records for components from a database using a database module, said components including components for use in assembling at least a portion of said tangible display fixtures and including components for display on said tangible display fixtures;

b) presenting listings of said components to a user by way of at least one panel on a user interface;

c) receiving user input comprising user selections of at least one specific tangible display fixture and of at least one component used in configuring said at least one specific tangible display fixture to result in a configured tangible display fixture;

d) receiving user input detailing that said configured tangible display fixture is complete;

e) generating a custom tag for use in tagging records for components used in said configured tangible display fixture;

f) applying said custom tag to metadata for records of all components detailed by said user input in step c);

g) determining fixture tags for said at least one specific tangible display fixture detailed in said user input in step c);

h) searching said database for records with said fixture tags determined in step g);

i) applying said custom tag to metadata of records found in step h);

j) searching said database for records with said custom tag;

k) compiling a list of components corresponding to said records found in step j); and j) presenting said list of components to said user;

wherein said method is implemented using a tagging module embodied in a server implementing said method, said tagging module being for automatically adding tags to records of said selected components regardless of a type or class of component;

wherein associations between components are implemented using said tags for their records such that associated components are associated with one another by having records that have common tags; and wherein said components for use in assembling at least a portion of specific tangible display fixtures have records with fixture tags denoting said specific tangible display fixtures.

9. The method according to claim 8, wherein said components include at least one of:
- promotional materials;
- marketing materials;
- mock ups of products;
- products to be displayed;
- physical parts for use in display unit assembly;
- signs for promoting products;
- signs for promoting services;
- marketing handouts;
- marketing flyers;
- marketing leaflets;
- marketing giveaways;
- shelves;
- nuts;
- bolts;
- screws; and
- display unit frame.

10. The method according to claim 8, wherein said tags comprise metadata added to said records of selected components.

11. The method according to claim 8, further comprising enabling said user to drag images of selected components from said at least one panel to a presentation panel on said user interface to thereby design or configure said tangible display fixture.

12. The method according to claim 8, wherein said components includes predesigned display units.

13. The method according to claim 8, further comprising displaying listings of said components to said user by way of two panels on said user interface.

14. The method according to claim 13, wherein said two panels comprises:
- a first panel listing components for use in assembling said tangible display fixture; and
- a second panel listing components for display on said tangible display fixture.

* * * * *